United States Patent
Kim et al.

(10) Patent No.: US 7,863,174 B2
(45) Date of Patent: Jan. 4, 2011

(54) VERTICAL PILLAR TRANSISTOR

(75) Inventors: Hui-Jung Kim, Seoul (KR); Yong-Chul Oh, Suwon-si (KR); Jae-Man Yoon, Hwaseong-si (KR); Hyun-Woo Chung, Seoul (KR); Hyun-Gi Kim, Hwaseong-si (KR); Kang-Uk Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/382,898

(22) Filed: Mar. 26, 2009

(65) Prior Publication Data

US 2009/0242975 A1    Oct. 1, 2009

(30) Foreign Application Priority Data

Mar. 28, 2008   (KR) ..................... 10-2008-0028957

(51) Int. Cl.
*H01L 21/3205*  (2006.01)
*H01L 27/118*  (2006.01)

(52) U.S. Cl. ............... 438/589; 257/204; 257/E21.652; 257/E21.635; 257/E29.262; 257/E29.189

(58) Field of Classification Search .................. 257/589, 257/E21.652, E21.635, E21.585, E29.262, 257/E21.693, 204, E21.41, E21.447, E29.189, 257/E21.141, E21.477; 438/589
See application file for complete search history.

(56) References Cited

U.S. PATENT DOCUMENTS

| 6,034,389 A | 3/2000 | Burns, Jr. et al. |
| 7,521,322 B2* | 4/2009 | Tang et al. .................. 438/270 |
| 2006/0231900 A1* | 10/2006 | Lee et al. ..................... 257/368 |

FOREIGN PATENT DOCUMENTS

| KR | 10-0660881 | 12/2006 |
| KR | 10-0723527 | 5/2007 |

* cited by examiner

*Primary Examiner*—Caridad M Everhart
(74) *Attorney, Agent, or Firm*—Harness, Dickey & Pierce, P.L.C.

(57) ABSTRACT

A vertical pillar transistor may include a plurality of lower pillars, a plurality of upper pillars, a first insulation part, a second insulation part and a word line. The plurality of lower pillars protrudes substantially perpendicular to a substrate and is defined by a plurality of trenches. The plurality of lower pillars extends along a second direction and may be separated from each other along a first direction substantially perpendicular to the second direction. The plurality of upper pillars may be formed on the plurality of lower pillars. The plurality of upper pillars has a width substantially smaller than that of the plurality of lower pillars. The first insulation part has a substantially uniform thickness on a sidewall of each of the plurality of lower pillars. The second insulation part may be formed on the first insulation part to fill a gap between the adjacent upper pillars. The word line may be formed on the second insulation part and may extend between facing sidewalls of the adjacent pair of upper pillars along the first direction.

9 Claims, 8 Drawing Sheets

SECOND DIRECTION
⊗ ⟶ FIRST DIRECTION

SECOND DIRECTION
⊗⎯⎯► FIRST DIRECTION

SECOND DIRECTION
⊗ → FIRST DIRECTION

VERTICAL PILLAR TRANSISTOR

PRIORITY STATEMENT

This application claims priority under 35 U.S.C. §119 to Korean Patent Application No. 2008-28957, filed on Mar. 28, 2008, in the Korean Intellectual Property Office (KIPO), the entire contents of which are herein incorporated by reference.

BACKGROUND

1. Field

Example embodiments relate to a vertical pillar transistor and a method of manufacturing the vertical pillar transistor. More particularly, example embodiments relate to a vertical pillar transistor having a uniform channel length and a method of manufacturing the vertical pillar transistor.

2. Description of the Related Art

As semiconductor devices are becoming highly integrated, line widths of patterns of the semiconductor devices and distances between the patterns are sharply decreasing. When the line widths of the patterns are reduced, channel lengths of transistors of the semiconductor devices are also reduced. However, when a transistor has a channel length that is smaller than that required for effective operation of the transistor, a short channel effect may be generated. As a result, electrical characteristics of the transistor may sharply deteriorate. Accordingly, transistors having various structures are being developed in order to obtain sufficient channel lengths. For example, a vertical pillar transistor, in which a pillar protruding substantially perpendicular to a substrate is used as a channel, is being developed. When forming the vertical pillar transistor, a space between adjacent pillars is filled with an insulation material, and the insulation material is partially removed for forming a word line in a subsequent process. However, as semiconductor devices have become highly integrated, distances between adjacent pillars have become reduced. Accordingly, when a vertical pillar transistor is manufactured through a conventional art, an insulation material may not be clearly removed in a removing process for partially removing the insulation material. As a result, a channel may not have a uniform length, and a bridge may be generated between word lines.

FIGS. 1 to 3 are cross-sectional views illustrating a conventional method of forming a vertical pillar transistor. Referring to FIG. 1, a plurality of pillar structures may be formed. The pillar structure may include a lower pillar 15, an upper pillar 20, a pad oxide layer 25, a hard mask 30, an oxide layer 35 and a spacer 40. After forming the lower pillar 15 and the upper pillar 20 on a substrate 10, the pad oxide layer 25 and the hard mask 30 are sequentially stacked on the upper pillar 20. The oxide layer 35 covering the upper pillar 20, the pad oxide layer 25 and the hard mask 30 may be formed. An impurity region 45 may be formed adjacent to a region between the lower pillar 15 and the upper pillar 20.

Referring to FIG. 2, a gap between the pillar structures may be filled with an insulation material 50, for example, inorganic spin-on glass (SOG) (e.g., Tonen Silazene (TOSZ)), which is a polysilazane material. The insulation material 50 may electrically insulate the adjacent pillar structures and the adjacent impurity regions 45 from each other, respectively. When the TOSZ layer is used as the insulation material 50, an annealing process may be performed to reduce the fluidity of the TOSZ layer, so that the TOSZ layer is hardened. When the gap has a deep depth, the annealing process may not have a sufficient effect on a lower portion of the TOSZ layer. Accordingly, the TOSZ layer may not be uniformly hardened, for example, the lower portion of the TOSZ layer may not be sufficiently hardened.

Referring to FIG. 3, the insulation material 50 may be partially removed to form an insulation layer 55, so that an upper face of the insulation layer 55 may be disposed in the gap between the pad oxide layer 25 and an upper portion of the lower pillar 15. When the insulation layer 55 is not uniformly hardened, the insulation layer 55 may have an irregular etching profile between the pillar structures or be overetched by an etching process. When a word line is formed on the insulation layer, the word line may not be uniformly formed. Accordingly, a semiconductor device having the word line may have undesirable reliability.

SUMMARY

Example embodiments provide a vertical pillar transistor having a uniform channel length. Example embodiments provide a method of manufacturing the vertical pillar transistor having a uniform channel length.

According to example embodiments, a vertical pillar transistor may include a plurality of lower pillars, a plurality of upper pillars, a first insulation part, a second insulation part and a word line. The plurality of lower pillars may protrude substantially perpendicular to a substrate and may be defined by a plurality of trenches. The plurality of lower pillars may extend along a second direction and may be separated from each other along a first direction substantially perpendicular to the second direction. Each of the plurality of upper pillars may be formed on each of the plurality of lower pillars. The plurality of upper pillars may have a width smaller than that of the plurality of lower pillars. The first insulation part may have a substantially uniform thickness on a sidewall of each of the plurality of lower pillars. The second insulation part may be formed on the first insulation part to fill a gap between the adjacent upper pillars. The word line may be formed on the second insulation part and may extend between facing sidewalls of the adjacent pair of upper pillars along the first direction. In example embodiments, the vertical pillar transistor may further include a gate insulation layer between the word line and the plurality of upper pillars.

In example embodiments, the vertical pillar transistor may further include a first impurity region on an edge portion of each of the plurality of lower pillars and a second impurity region on each of the plurality of upper pillars. In example embodiments, the first insulation part may block an entrance of the trench and a void enclosed by the first insulation part may be formed in the trench. In example embodiments, the trench may have a curved sidewall. The sidewall may have an acute angle with respect to an upper face of each of the plurality of lower pillars.

In example embodiments, the first insulation part may include an oxide and the second insulation part may include Tonen Silazene (TOSZ). In example embodiments, the first insulation part may have a thickness smaller than about 50% of a distance between adjacent upper pillars and larger than about 50% of the width of the trench entrance. In example embodiments, the plurality of upper pillars may be separated to be isolated from each other along the first direction. In example embodiments, a plurality of the word lines may be separated from each other along the second direction.

According to example embodiments, there is provided a method of manufacturing a vertical pillar transistor. A plurality of upper pillars may be formed on a substrate and may be separated from each other along a first direction. A plurality of lower pillars having a width substantially larger than that of the upper pillars may be formed by forming a plurality of trenches extending along a second direction substantially perpendicular to the first direction. The plurality of lower pillars may protrude substantially perpendicular to the substrate. A first insulation part having a substantially uniform thickness may be formed on a sidewall of the plurality of upper pillars. A second insulation part may be formed on the first insulation part to fill a gap between the adjacent upper pillars. A word line extending between facing sidewalls of the adjacent pair of upper pillars along the first direction may be formed on the second insulation part.

In example embodiments, prior to forming the word line, a portion of the second insulation part may be removed and a gate insulation layer may be formed on a sidewall of each of the plurality of upper pillars. In example embodiments, prior to forming the trenches, impurities may be implanted into an upper portion of the substrate. In example embodiments, the first insulation part may be formed by an atomic layer deposition (ALD) process.

In example embodiments, the second insulation part may be formed by depositing TOSZ on the first insulation part and annealing the TOSZ. In example embodiments, the trench may have a curved sidewall. The sidewall may have an acute angle with respect to an upper face of each of the plurality of lower pillars. In example embodiments, a void may be formed in the trench by blocking an entrance of the trench using the first insulation part when the first insulation part is formed.

In example embodiments, the plurality of lower pillars may be formed by forming a sacrificial layer on a sidewall of the upper pillars and forming the plurality of trenches by an etching process using the plurality of upper pillars and the sacrificial layer as an etching mask. In example embodiments, the first insulation part may have a thickness smaller than about 50% of a distance between adjacent upper pillars and larger than about 50% of the width of the trench entrance.

According to example embodiments, there is provided a method of manufacturing a vertical pillar transistor. A plurality of upper pillars is formed on a substrate. The plurality of upper pillars is separated from each other along a first direction. A plurality of lower pillars is formed beneath the plurality of upper pillars. The plurality of lower pillars has a width larger than that of the respective upper pillar by forming a plurality of trenches extending along a second direction substantially perpendicular to the first direction. The plurality of lower pillars protrudes substantially perpendicular to the substrate. A first insulation part having a substantially uniform thickness is formed on a sidewall of at least one of the plurality of upper pillars and including a void formed in each of the plurality of trenches by blocking an entrance of each of the plurality of trenches using the first insulation part. A second insulation part is formed on the first insulation part to fill a gap between an adjacent pair of the upper pillars.

According to example embodiments, a word line may be uniformly formed on a substrate. Additionally, a void may be formed between adjacent bit lines, so that parasitic capacitance between the bit lines may be reduced. Accordingly, a semiconductor device may have enhanced reliability.

BRIEF DESCRIPTION OF THE DRAWINGS

Example embodiments will be more clearly understood from the following detailed description taken in conjunction with the accompanying drawings.

FIG. 4 is a cross-sectional view illustrating a vertical pillar transistor in accordance with example embodiments; and FIGS. 5 to 16 are cross-sectional views illustrating a method of forming a vertical pillar transistor in accordance with example embodiments.

Figure 1:
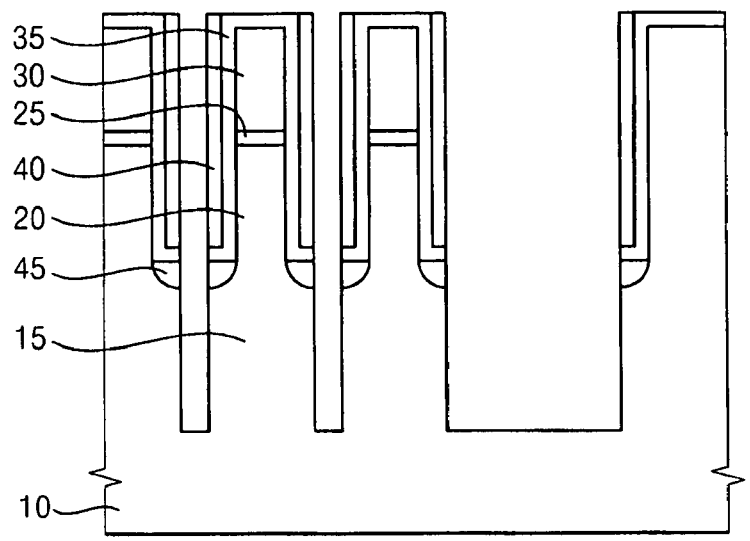
FIGS. 1 to 3 are cross-sectional views illustrating a conventional method of forming a vertical pillar transistor.
Figure 2:
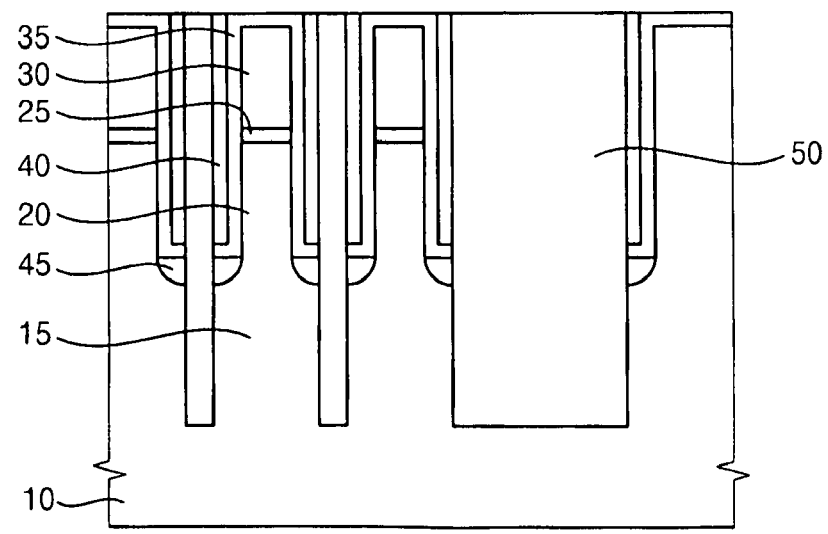
Figure 3:
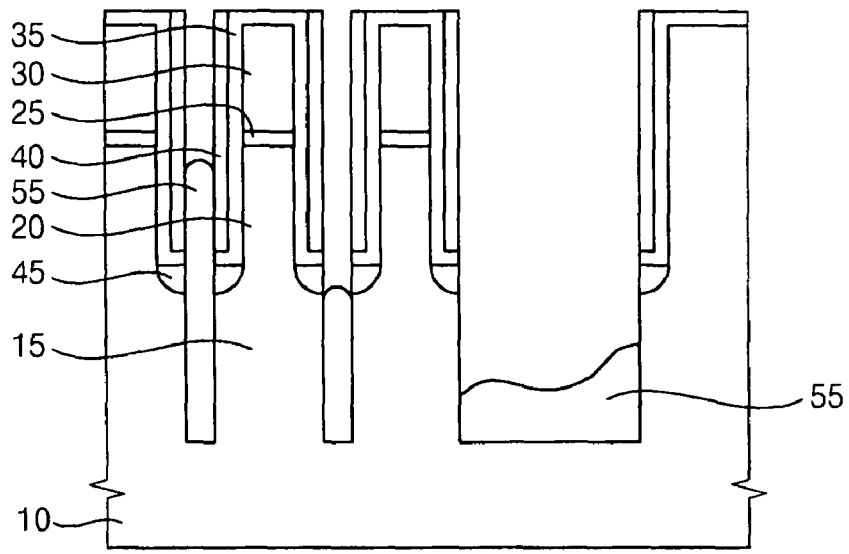

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

Figure 4:
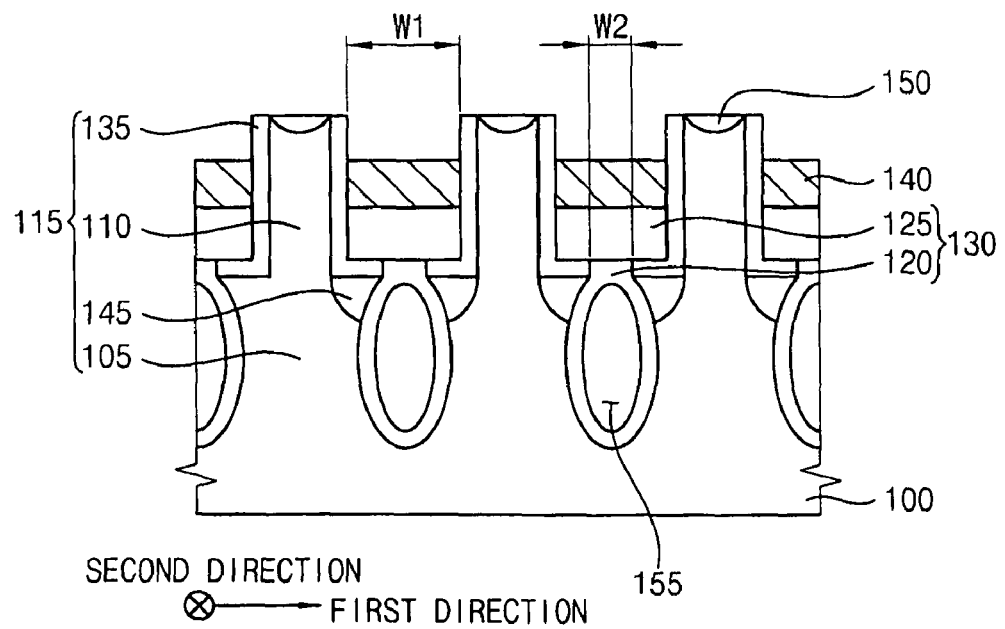
FIGS. 4 to 16 represent non-limiting, example embodiments as described herein.

FIG. 4 is a cross-sectional view illustrating a vertical pillar transistor in accordance with example embodiments. Referring to FIG. 4, a vertical pillar transistor may include a plurality of pillar structures 115 on a substrate 100 and word lines 140 extending along a first direction. The substrate 100 may include a semiconductor substrate include silicon (Si), germanium (Ge), or a silicon-on-insulator (SOI) substrate.

The pillar structure 115 may include a lower pillar 105 substantially perpendicular to the substrate 100, an upper pillar 110 formed on the lower pillar 105, a first impurity region 145, a second impurity region 150 and a gate insulation layer 135.

The lower pillar 105 may extend along a second direction substantially perpendicular to the first direction. Each of the lower pillars 105 may extend along the second direction and may be separated from each other along the first direction by a trench (not shown). The trench may have a cross-section of an elliptical shape when taken along the first direction. An upper sidewall of the trench (not shown) may have an acute angle with respect to an upper face of the lower pillar 105.

The upper pillar 110 has a column shape. The upper pillar 110 may have a circular shape or a polygonal shape in a plan view. The plurality of upper pillars 110 may be separated from each other along the first and second directions, respectively, and may be formed on the lower pillar 105. The lower pillar may be formed to extend along the second direction. The upper pillar 110 may be formed on the lower pillar 105, and may be separated and isolated from each other. The upper pillar 110 may have a width smaller than that of the lower pillar 105. A channel length formed on the upper pillar 110 may be controlled by adjusting a length and the width of the upper pillar 110.

An insulation structure 130 may be formed on a bottom portion and a sidewall of the trench, and a space between adjacent gate insulation layers 135 covering the upper pillar 110. The insulation structure 130 may include a first insulation part 120 and a second insulation part 125. The first insulation part 120 may include an oxide layer formed by an atomic layer deposition (ALD) process. The first insulation part 120 may be formed on a bottom portion and a sidewall of the trench with a uniform thickness. The first insulation part 120 may be formed on a sidewall of the lower pillar 105 to have a relatively uniform thickness. The first insulation part 120 may not completely fill an inner space of the trench and close an entrance of the trench.

Accordingly, a void 155 enclosed by the first insulation part 120 may be formed. The void 155 may reduce parasitic capacitance generated between the adjacent first impurity regions 145. In example embodiments, the first insulation part 120 may have a thickness substantially smaller than about 50% of a first width W1, which is a distance between adjacent upper pillars 110. The first insulation part 120 may have a thickness substantially larger than about 50% of a second width W2, which is the width of the trench entrance.

A second insulation part 125 may be formed on the first insulation part 120 to fill a space between the adjacent gate insulation layers 125 on the upper pillar 110. In example embodiments, the second insulation part 125 may include Tonen Silazene (TOSZ). The second insulation part 125 may have different etching selectivity with respect to the first insulation part 120. The second insulation part 125 may be made up of several different materials as described in further detail regarding FIG. 13.

The first impurity region 145 may be formed on an upper portion of the lower pillar 105. That is, the first impurity region 145 may be formed on an upper portion of the lower pillar 105 adjacent to the trench. The first impurity region 145 may extend along the second direction on the upper portion of the lower pillar 105. First impurities implanted into the first impurity region 145 may include an element of Group III or Group V of the periodic table, or a combination thereof. The first impurity region 145 may serve as a source region or a drain region. Alternatively, the first impurity region 145 may serve as a bit line of a semiconductor device.

A second impurity region 150 may be formed on an upper portion of the upper pillar 110. Second impurities implanted into the second impurity region 150 may include the same element as that of the first impurity region 145 or a different element from that of the first impurity region 145.

The gate insulation layer 135 may be formed to cover a sidewall of the upper pillar 110. The gate insulation layer 135 may include an oxide, e.g., an oxide formed by a thermal oxidation process. The gate insulation layer 135 may insulate a word line 140 from a channel region.

The word line 140 is formed on the second insulation part 125 and extends between the sidewalls of the gate insulation layer 135 on the facing sidewalls of the adjacent upper pillars along the first direction. Each word line 140 is disposed along the second direction, and the word lines 140 are arrayed along the first direction. The word line 140 may include polysilicon doped with impurities, metal, metal nitride or metal silicide. Examples of the metal, metal silicide and metal nitride may include tungsten (W), titanium (Ti), tantalum (Ta), tungsten nitride ($WN_x$), titanium nitride (TiN), tantalum nitride (TaN), tungsten silicide ($WSi_x$), titanium silicide ($TiSi_x$) and tantalum silicide ($TaSi_x$).

The word line 140 may serve as not only a gate electrode for a pillar structure 115 but also a word line. Accordingly, a contact resistance between a word line and a gate electrode may not be generated.

According to example embodiments, because the vertical pillar transistor has a structure in which the first insulation part 120 is formed between the lower pillars 105, and the second insulation part 125 may be formed on the first insulation part 120, the second insulation part 125 may have a small thickness. Thus, the second insulation part 125 may be sufficiently hardened. Accordingly, the second insulation part 125 may be etched with a uniform depth. As a result, the word line 140 may be uniformly formed on the second insulation part 125. A semiconductor device may have improved reliability. Additionally, the void 155 may be formed in an inner space of the trench, and thus parasitic capacitance between adjacent bit lines formed around the first insulation part may be reduced.

Figure 5:
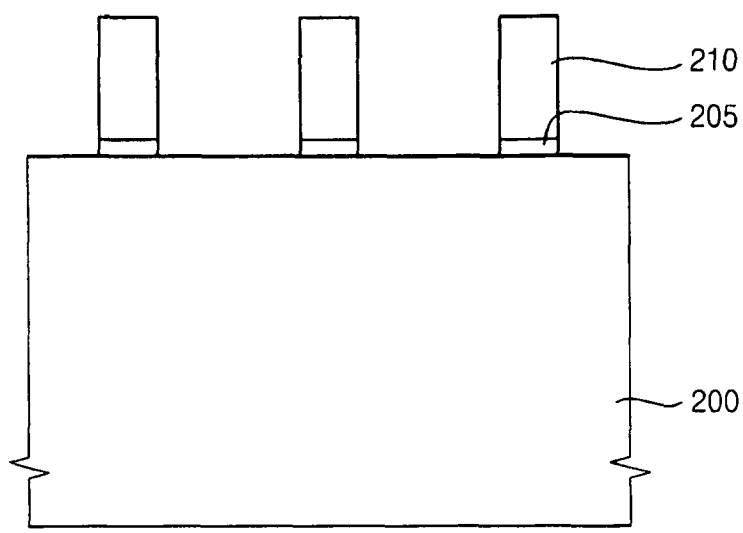

FIGS. 5 to 16 are cross-sectional views illustrating a method of forming a vertical pillar transistor in accordance with example embodiments. Referring to FIG. 5, a pad oxide layer (not shown) and a mask (not shown) may be sequentially formed on a substrate 200. The substrate 200 may be a semiconductor substrate including silicon (Si) or germanium (Ge), or an SOI substrate.

The pad oxide layer may be formed by performing a thermal oxidation process to an upper portion of the substrate 200 or a chemical vapor deposition (CVD) process using silicon oxide ($Si_xO_y$). The pad oxide layer may reduce stress between the substrate 200 and the mask. The mask may be formed using a material having an etching selectivity with respect to the substrate 200 and the pad oxide layer. The mask may be formed using silicon nitride ($Si_xN_y$), silicon oxynitride ($SiO_xN_y$), or titanium oxynitride ($TiO_xN_y$).

A photoresist pattern (not illustrated) defining a region for an upper pillar (215, see FIG. 6) may be formed on the mask. The mask may be etched by an anisotropic etching process using the photoresist pattern as an etch mask to form a first mask 210 and a pad oxide layer pattern 205. The photoresist pattern may be removed from the first mask 210 by an ashing process and/or a strip process.

The first mask 210 may serve as an etch mask for forming the upper pillar 215 (see FIG. 6) and an upper pillar mask (not shown) protecting the upper pillars in a subsequent process. Additionally, the first mask 210 may serve as an ion implanting mask in an ion implantation process forming impurity regions.

Figure 6:
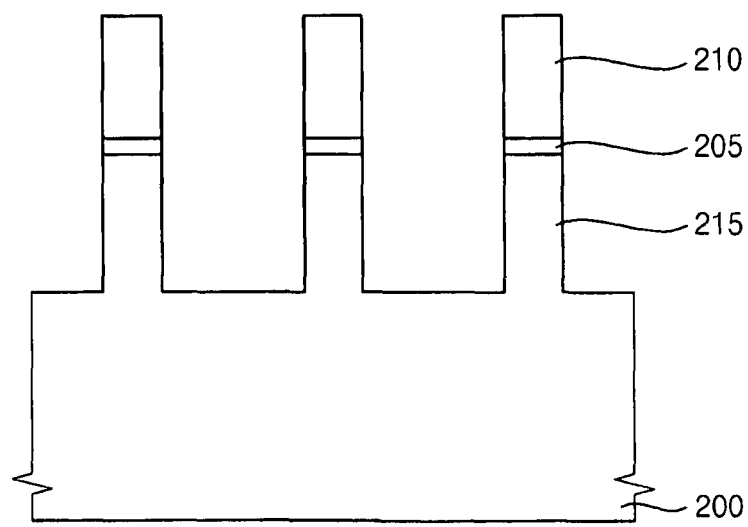

Referring to FIG. 6, an upper portion of the substrate 200 may be partially etched to form a plurality of upper pillars 215 using the first mask 210 and the pad oxide layer pattern 205 as an etch mask. Each of the pillars 215 may be perpendicularly protruded from the substrate. The upper pillars 215 may be formed to be separated from each other along a first direction. Also, the upper pillars 215 may be formed to be separated from each other along a second direction substantially perpendicular to the first direction. That is, each of the upper pillars 215 may be formed to be isolated from each other. The upper pillar 215 may have a circular shape or a polygonal shape in a plan view. The etching process etching the upper portion of the substrate 200 may include an anisotropic dry etching process. A structure in which the upper pillar 215, the pad oxide layer pattern 205 and the first mask are sequentially stacked will be referred to as a preliminary pillar structure.

Figure 7:
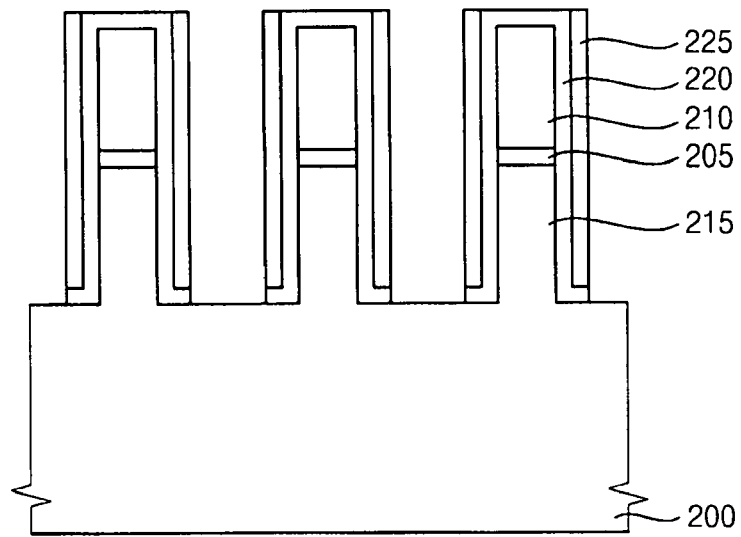

Referring to FIG. 7, an oxide layer 220 may be formed on the substrate 200 to cover the preliminary pillar structure. The oxide layer 220 may be formed by an oxidation process. The oxide layer 220 may be formed on the preliminary pillar structure with a relatively uniform thickness. A spacer layer (not illustrated) may be formed on the oxide layer 220. The spacer layer may be formed using a material having an etching selectivity with respect to the substrate 200. For example, the spacer layer may be formed using a nitride layer or an oxynitride layer. The spacer layer may be formed on the oxide layer 220 with a uniform thickness. The spacer layer may be etched to form a spacer 225 on a sidewall of the oxide layer by an etching process, e.g., an etch-back process. The spacer 225 may prevent or reduce a sidewall of the preliminary pillar structure from being etched when the substrate 200 is etched. The oxide layer 220 may be partially etched using the spacer 225 as an etch mask. Alternatively, the oxide layer 220 may be partially removed before forming the spacer 225. Alternatively, the spacer 225 may not be formed.

Figure 8:
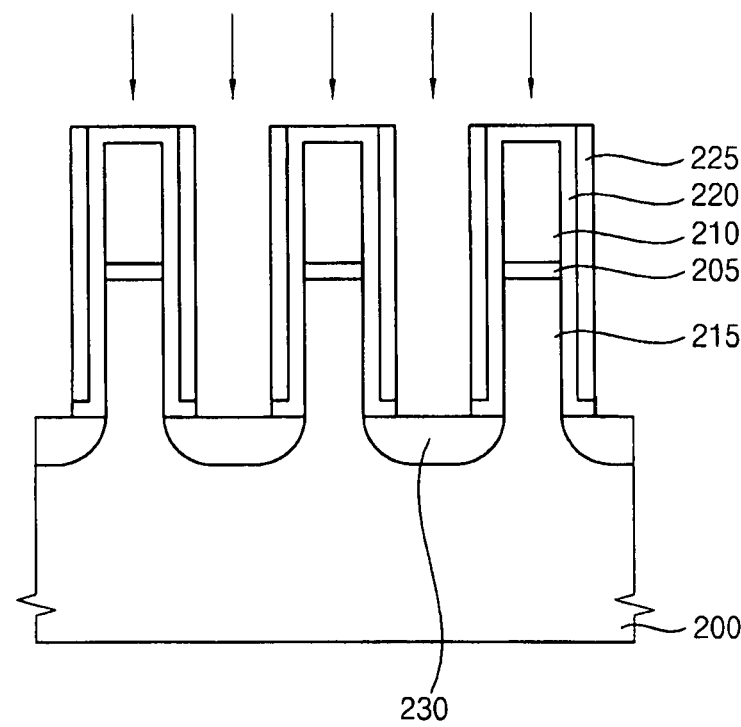

Referring to FIG. 8, impurities may be implanted into an upper portion of the substrate 200 exposed by the spacer 225. The impurities may include an element of Group III or Group V of the periodic table, or a combination thereof. After implanting the impurities, a thermal diffusion process may be performed on the upper portion of the substrate to form a first impurity region 230. The impurities may move toward a lower portion of the upper pillar 215 due to the thermal diffusion process. However, each of the first impurity regions 230 may not be electrically connected to each other under the upper pillar 215. The first impurity regions 230 may serve as a source region or a drain region.

Figure 9:
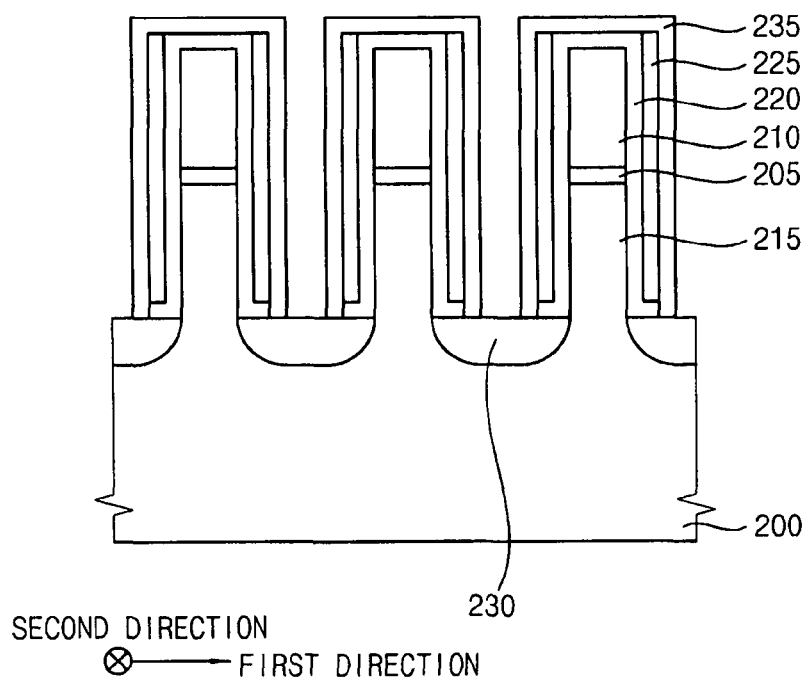

Referring to FIG. 9, a first sacrificial layer (not illustrated) may be formed on the substrate 200 to cover the oxide layer 220 and the spacer 225. In example embodiments, the first sacrificial layer may be formed using an oxide material. For example, the first sacrificial layer may be formed using borophosphosilicate glass (BPSG), TOSZ, undoped silicate glass (USG), spin-on glass (SOG), flowable oxide (FOx), tetraethyl orthosilicate (TEOS), or high-density plasma chemical vapor deposition (HDP-CVD) oxide.

The first sacrificial layer may be planarized and a photoresist pattern (not illustrated) may be formed on the planarized first sacrificial layer. The first sacrificial layer may be etched using the photoresist pattern as an etch mask to form a first sacrificial layer pattern 235 exposing a portion of the substrate 200. A plurality of the first sacrificial layer patterns 235 may be formed, and each of the first sacrificial layer patterns 235 may extend along the second direction and be separated from each other along the first direction. The photoresist pattern may be removed by an ashing process and/or a strip process.

Figure 10:
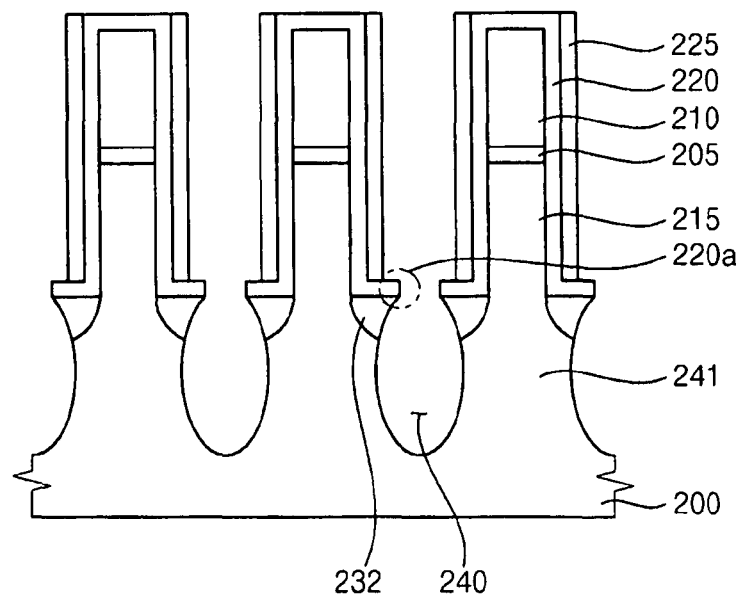

Referring to FIG. 10, an exposed portion of the substrate 200 may be removed using the first sacrificial layer pattern 235 as an etching mask to form a trench 240 by an etching process. The first impurity region 230 may also be partially removed to form a bit line 232 through the etching process. In example embodiments, the etching process may include a dry etching process, e.g., a reaction ion etching (RIE) process. A plurality of the trenches 240 may be formed. Each of the trenches 240 may extend along the second direction. Also, each of the trenches 240 may be separated from each other along the first direction. The trench 240 defines a lower pillar 241. The trench 240 may have a curved sidewall, e.g., an elliptical shape.

According to example embodiments, a plurality of the bit lines 232 may be formed. The bit line 232 may extend along the second direction. Because the trench 240 has a curved sidewall, an interference phenomenon between the adjacent bit lines 232 may be reduced, and parasitic capacitance may be reduced. A lower portion of the substrate 200 under the preliminary pillar structure may be separated from each other, and the separated portion may be defined as the lower pillars 241. Each of the lower pillars 241 may extend along the second direction and be separated from each other along the first direction. The lower pillar 241 may have a width substantially larger than that of the upper pillar 215.

Figure 11:
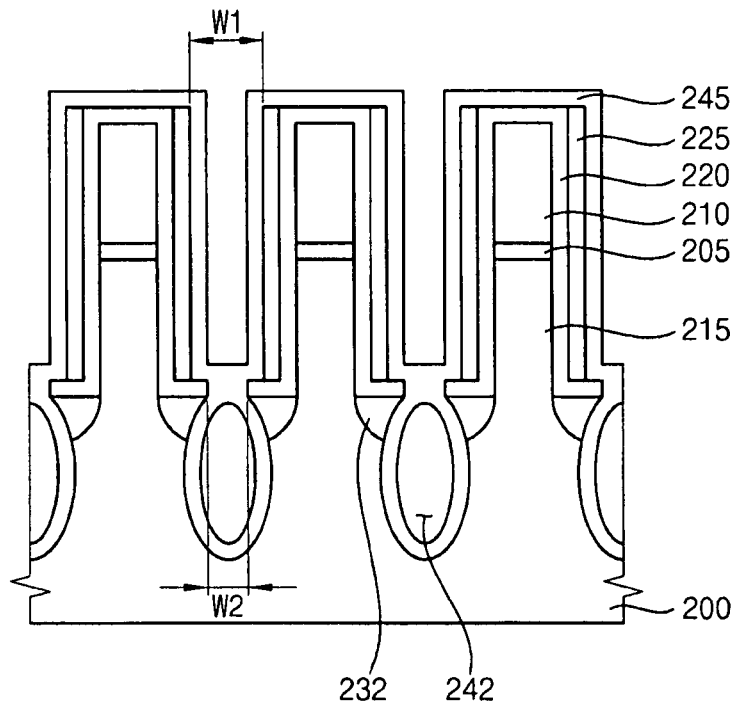

The first sacrificial layer pattern 235 may be removed. Accordingly, a protruding portion 220*a* may be formed on the bit line 232. The protruding portion 220*a* may reduce the resistance of the bit line 232. Referring to FIG. 11, a first insulation part 245 may be formed on a bottom portion and a sidewall of the trench 240, the oxide layer 220 and a surface of the spacer 225 with a relatively uniform thickness. In example embodiments, the first insulation part 245 may be formed by an ALD process using oxide.

The first insulation part 245 may be formed until the first insulation part 245 blocks an entrance of the trench 240. The trench 240 may have a curved sidewall. A middle portion of the trench 240 has a width substantially larger than that of the entrance. Accordingly, when the first insulation part 245 is formed until the first insulation part 245 blocks an entrance of the trench 240 with a relatively uniform thickness, a void 242 may be formed in the trench 240. The void 242 may reduce parasitic capacitance between the adjacent bit lines 232.

In example embodiments, the first insulation part 245 may have a thickness substantially smaller than about 50% of a first width W1, which is a distance between adjacent spacers 225. The first insulation part 245 may have a thickness substantially larger than about 50% of a second width W2, which is a distance of the entrance. When the first insulation part 245 has a thickness substantially larger than about 50% of the first width W1, the adjacent first insulation parts 245 may make contact with each other around an upper portion of the spacer 225 to form a void around the spacer 225. The void may decrease the reliability of a semiconductor device. When first insulation part 245 has a thickness substantially smaller than about 50% of the second width W2, the entrance of the trench 240 may not be closed. Accordingly, the void 242 may be filled with an insulation material for forming a second insulation part in a subsequent process. When the void 242 is filled with the second insulation part, parasitic capacitance between the bit lines 232 may be increased. Thus, the first insulation part 245 may have a thickness substantially smaller than about 50% of the first width W1. The first insulation part 245 may have a thickness substantially larger than about 50% of the second width W2.

Figure 12:
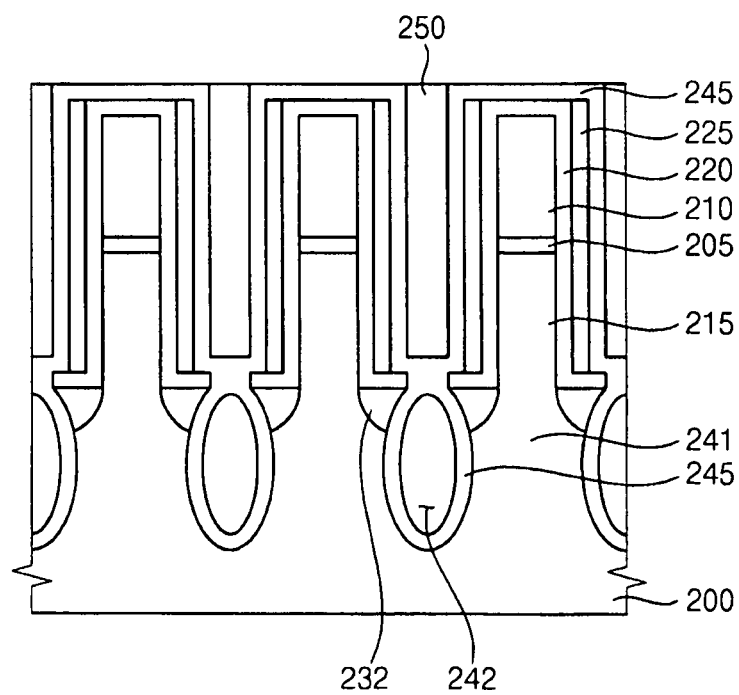

Referring to FIG. 12, a second insulation part 250 may be formed on the first insulation part 245 to fill a space between the adjacent preliminary pillar structures. The second insulation part 250 may have a sufficient thickness to fill a gap between the adjacent preliminary pillar structures. Because the first insulation part 245 blocks the entrance of the trench 240, the second insulation part 250 may not fill the void 242. The second insulation part 250 may be formed by a spin-coating process, a CVD process, an ALD process, or a plasma-enhanced chemical vapor deposition (PECVD) process. In example embodiments, the second insulation part 250 may be formed using TOSZ. The TOSZ has high fluidity, so that the TOSZ may have improved filling characteristics when filling a space between adjacent structures having a relatively large aspect ratio. When the second insulation part 250 is formed using the TOSZ, a hardening process, e.g., a hard baking process, may be performed. The hard baking process may be performed at a temperature of about 400° C. When the first insulation part 245 is formed using ALD oxide, the characteristics of the first insulation part 245 may not be changed by the hard baking process. An upper surface of the second insulation part 250 may be planarized by a chemical mechanical polishing (CMP) process and/or an etch-back process.

Figure 13:
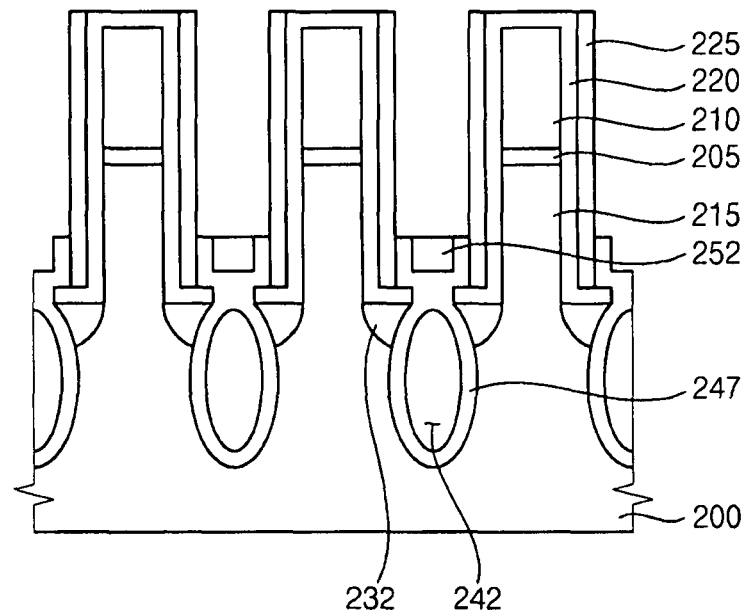

Referring to FIG. 13, the second insulation part 250 and the first insulation part 245 between the preliminary pillar structures may be partially removed to expose the spacer 225 on a sidewall of the upper pillar 215. The removing process may include a wet etching process. The second insulation part 250 and the first insulation part 245 may be simultaneously removed by one etching process. Thus, the removing process may be relatively simple. Because a word line (265, see FIG. 15) is formed to extend between facing sidewalls of the adjacent pair of the upper pillars 215, a thickness of the word line 265 may be controlled by controlling a portion of the upper pillar 215 exposed by the removing process. The first insulation part 245 may be removed until the entrance of the trench 240 is closed. The second insulation part 250 may be completely removed. Alternatively, the second insulation part 250 and the first insulation part 245 may be partially removed to remain as a first insulation part pattern 247 and a second insulation part pattern 252 as illustrated in FIG. 13.

Figure 14:
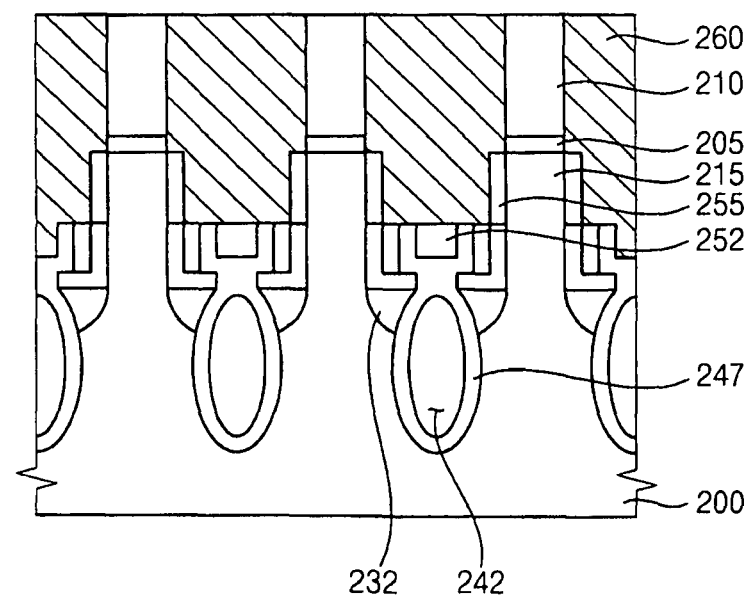

Referring to FIG. 14, the pad oxide layer 220 and the spacer 225 may be partially removed to expose sidewalls of the mask 210, the pad oxide layer pattern 205 and the upper pillar 215. A gate insulation layer 255 may be formed on the sidewall of the exposed upper pillar 215. A conductive layer (not shown) may be formed to cover the preliminary pillar structure.

The gate insulation layer 255 may be formed on the sidewall of the exposed upper pillar 215 by a thermal oxidation process or a deposition oxidation process. The gate insulation layer 255 may be formed using silicon oxide ($Si_xO_y$) or a metal oxide having a high dielectric constant. The metal oxide having a high dielectric constant may include tantalum oxide ($Ta_xO_y$), titanium oxide ($Ti_xO_y$), hafnium oxide ($Hf_xO_y$), zirconium oxide ($Zr_xO_y$), aluminum oxide ($Al_xO_y$), yttrium oxide ($Y_xO_y$) or lanthanum oxide ($La_xO_y$). Alternatively, after removing the oxide layer 220 completely, a gate insulation layer 255 may be formed on a sidewall of the upper pillar 215. A pillar structure including the gate insulation layer 255, the lower pillar 241, the upper pillar 215, the pad oxide layer pattern 205 and the first mask 210 may be formed.

A gate conductive layer 260 may be formed to cover the pillar structure after forming the gate insulation layer 255. The gate conductive layer 260 may be formed using a polysilicon doped with impurities, silicon germanium (SiGe), tungsten (W), copper (Cu), titanium (Ti), tantalum (Ta), or aluminum (Al). The gate conductive layer 260 may further comprise tungsten silicide ($WSi_x$), cobalt silicide ($CoSi_x$), titanium silicide ($TiSi_x$), or nickel silicide ($NiSi_x$).

Figure 15:
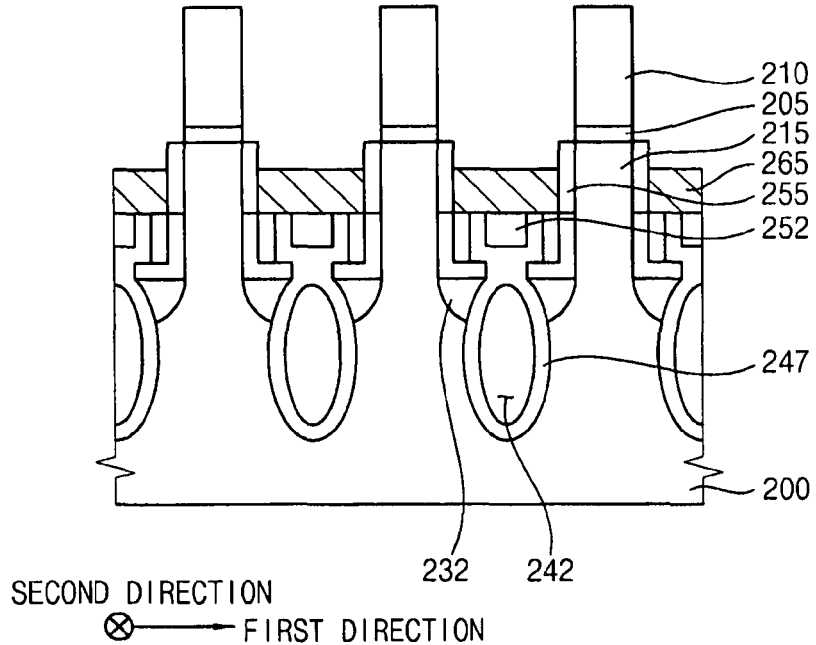

Referring to FIG. 15, the gate conductive layer 260 may be etched to exposed a surface of the first mask 210 by a planarization process, e.g., a CMP process, and the gate conductive layer 260 may be partially removed by a wet etching process until an upper face of the gate conductive layer 260 is disposed lower than an upper face of the upper pillar 215. A word line 265 extending between facing sidewalls of the adjacent upper pillars 215 and extending along the first direction may be formed on the second insulation part 125. In example embodiments, the first mask 210 and the pad oxide layer pattern 205 may be removed together.

The word line 265 may be formed to enclose a lower portion of the upper pillars 215. The word line 265 may extend along the first direction. Each of the word lines 265 may be separated from each other along the second direction at uniform intervals. The word line 265 may serve as not only a word line for a transistor, but also a gate electrode. Accordingly, a contact resistance between a word line and a gate electrode may not be generated.

Figure 16:
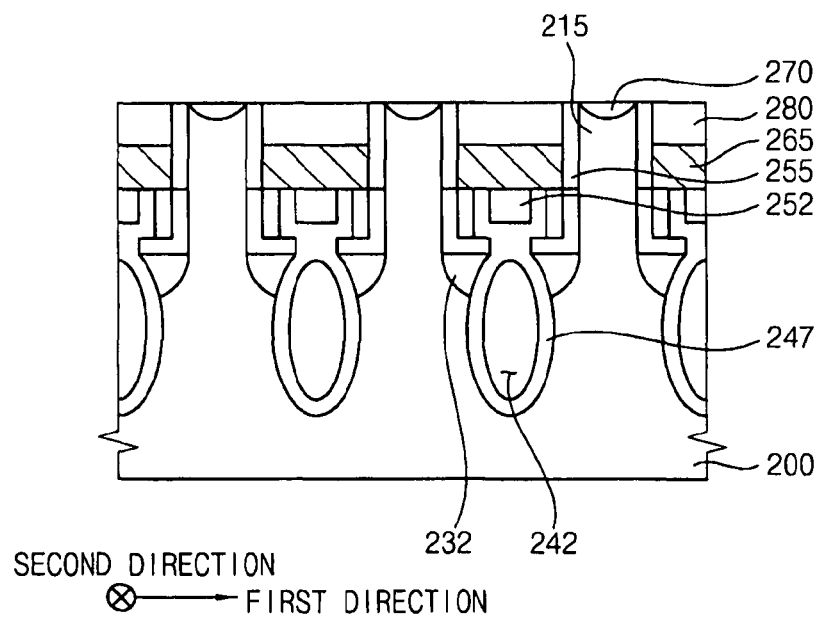

Referring to FIG. 16, the pad oxide layer pattern 205 and the first mask 210 may be removed to expose an upper face of the upper pillar 215. Impurities may be implanted into an upper portion of the upper pillar 215 to form a second impurity region 270. The impurities implanted into second impurity region 270 may include an element of Group III or Group V of the periodic table, or a combination thereof. The second impurity region 270 may serve as a source region or a drain region of a transistor.

A first insulating interlayer 280 may be formed on the substrate 200 to fill a gap between the adjacent upper pillars 215. The first insulating interlayer 280 may be formed using BPSG, TOSZ, USG, SOG, FOx, TEOS, or HDP-CVD oxide. The first insulating interlayer 280 may be partially removed to expose a portion of the second impurity region 270. The removing process may include a CMP process, an etch-back process or a combination thereof. As a result, a vertical pillar transistor in accordance with example embodiments may be formed.

According to example embodiments, a word line may be uniformly formed on a substrate. Additionally, a void may be formed between adjacent bit lines, so that parasitic capacitance between the bit lines may be reduced. Accordingly, a semiconductor device may have enhanced reliability.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical pillar transistor comprising:
   a plurality of lower pillars protruding substantially perpendicular to a substrate and defining a plurality of trenches, the plurality of lower pillars extending along a second direction and separated from each other along a first direction, the first direction substantially perpendicular to the second direction;
   a plurality of upper pillars, each of the plurality of upper pillars respectively on each of the plurality of lower pillars, and each of the plurality of upper pillars having a width smaller than that of the respective lower pillar;
   a first insulation part having a substantially uniform thickness on a sidewall of at least one of the plurality of lower pillars;
   a second insulation part on the first insulation part to fill a gap between an adjacent pair of the plurality of upper pillars; and
   a word line on the second insulation part and extending between facing sidewalls of the adjacent pair of upper pillars along the first direction,
   wherein the first insulation part blocks an entrance of each of the plurality of trenches to form a void in at least one of the plurality of trenches.

2. The vertical pillar transistor of claim 1, further comprising:
   a gate insulation layer between the word line and the plurality of upper pillars.

3. The vertical pillar transistor of claim 1, further comprising:
   a first impurity region on an edge portion of at least one of the plurality of lower pillars; and
   a second impurity region on at least one of the plurality of upper pillars.

4. The vertical pillar transistor of claim 1, wherein each of the plurality of trenches has a curved sidewall, the sidewall making an acute angle with respect to an upper face of each of the plurality of lower pillars.

5. The vertical pillar transistor of claim 1, wherein the first insulation part includes oxide and the second insulation part includes polysilazane material.

6. The vertical pillar transistor of claim 1, wherein the first insulation part has a thickness smaller than about 50% of a distance between adjacent upper pillars and larger than about 50% of the width of the trench entrance.

7. The vertical pillar transistor of claim 1, wherein the plurality of upper pillars are separated or isolated from each other along the first direction.

8. The vertical pillar transistor of claim 1, wherein a plurality of the word lines are separated from each other along the second direction.

9. A vertical pillar transistor comprising:
   a plurality of lower pillars protruding substantially perpendicular to a substrate and defining a plurality of trenches, the plurality of lower pillars extending along a second direction and separated from each other along a first direction, the first direction substantially perpendicular to the second direction;
   a plurality of upper pillars, each of the plurality of upper pillars respectively on each of the plurality of lower pillars, and each of the plurality of upper pillars having a width smaller than that of the respective lower pillar;
   a first insulation part having a substantially uniform thickness on a sidewall of at least one of the plurality of lower pillars; and
   a second insulation part on the first insulation part to fill a gap between an adjacent pair of the plurality of upper pillars,
   wherein the first insulation part blocks an entrance of each of the plurality of trenches and includes a void enclosed by the first insulation part in at least one of the plurality of trenches.

* * * * *